(12) United States Patent
Kang et al.

(10) Patent No.: US 6,836,425 B2
(45) Date of Patent: *Dec. 28, 2004

(54) CODING CELL OF NONVOLATILE FERROELECTRIC MEMORY DEVICE AND OPERATING METHOD THEREOF, AND COLUMN REPAIR CIRCUIT OF NONVOLATILE FERROELECTRIC MEMORY DEVICE HAVING THE CODING CELL AND METHOD FOR REPAIRING COLUMN

(75) Inventors: Hee Bok Kang, Daejeon-shi (KR); Hun Woo Kye, Kyonggi-do (KR); Duck Ju Kim, Cheju-do (KR); Je Hoon Park, Kyonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/653,238

(22) Filed: Sep. 3, 2003

(65) Prior Publication Data

US 2004/0042245 A1 Mar. 4, 2004

Related U.S. Application Data

(62) Division of application No. 10/160,158, filed on Jun. 4, 2002, now Pat. No. 6,639,857.

(30) Foreign Application Priority Data

Jun. 11, 2001 (KR) ...................................... P2001-32476

(51) Int. Cl.[7] .............................................. G11C 29/00
(52) U.S. Cl. .................... 365/145; 365/149; 365/185.08
(58) Field of Search ........................... 365/145, 185.08, 365/149, 200

(56) References Cited

U.S. PATENT DOCUMENTS

| 5,523,974 | A | 6/1996 | Hirano et al. ................ 365/200 |
| 6,157,585 | A | 12/2000 | Kim ........................... 365/200 |
| 6,175,528 | B1 | 1/2001 | Kye ........................... 365/200 |
| 6,317,355 | B1 | 11/2001 | Kang ......................... 365/145 |
| 6,597,608 | B2 * | 7/2003 | Kang et al. ................. 365/200 |

* cited by examiner

Primary Examiner—Tan T. Nguyen
(74) Attorney, Agent, or Firm—Piper Rudnick LLP

(57) ABSTRACT

A fail repair circuit of a nonvolatile ferroelectric memory device and a method for repairing the same are disclosed, in which a redundancy time can be reduced and a redundancy algorithm can be changed or added at any time. The fail repair circuit includes: a memory test logic block generating a redundancy active pulse (RAP) if a row address including a fail bit to be repaired is found during test; a power-up sensor generating a power-up pulse if a stable power source voltage is sensed; a first redundancy control block generating first to fifth control signals ENN, ENP, EQN, CPL, and PREC and a sixth control signal ENW in response to the RAP and the power-up pulse; a counter generating n bit counter bit signal increased by one bit through the RAP to correspond to the number of redundancy bits; a redundancy counter decoding control block generating an activated coding signal ENW<n> in response to the counter bit signal of the counter and the sixth control signal ENW; and a redundancy coding block outputting a master signal in response to the coding signal ENW<n> and the first to fifth control signals, programming a fail address in a plurality of redundancy coding cells, and outputting seventh and eighth control signals REN<n> and RPUL<n> to repair the programmed fail address.

6 Claims, 12 Drawing Sheets

US 6,836,425 B2

CODING CELL OF NONVOLATILE FERROELECTRIC MEMORY DEVICE AND OPERATING METHOD THEREOF, AND COLUMN REPAIR CIRCUIT OF NONVOLATILE FERROELECTRIC MEMORY DEVICE HAVING THE CODING CELL AND METHOD FOR REPAIRING COLUMN

This application is a Divisional patent application under 37 C.F.R. §1.53(b), of prior application Ser. No. 10/160,158, filed on Jun. 4, 2002, now U.S. Pat. No. 6,639,857, of:

The present invention claims the benefit of Korean Patent Application No. P2001-32476 filed in Korea on Jun. 11, 2001, which is hereby incorporated by reference.

BACKGROUND OF THE INVENTION

1. Field of the Invention

The present invention relates to a semiconductor memory device, and more particularly, to a fail repair circuit of a nonvolatile ferroelectric memory device and a method for repairing the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows a unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T with a gate connected with the wordline and a source connected with the bitline, and a ferroelectric capacitor FC. A first terminal of the ferroelectric capacitor FC is connected with a drain of the transistor T and a second terminal is connected with the plate line P/L.

A redundancy algorithm of the related art nonvolatile ferroelectric memory device will now be described with reference to FIG. 3.

As shown in FIG. 3, a full address memory test and a fail bit analysis are carried out in such a manner that a chip test is carried out after a prior process to find out a fail address.

When the analyzed fail address can be repaired by a row repair circuit, a fuse is cut using a laser beam to code a corresponding address in a row repair fuse block.

Once the corresponding fail address is input after the fuse cutting is completed, an active signal of the repair circuit is generated to activate a repair cell.

Meanwhile, a main cell corresponding to the fail address is inactivated by an inactive signal of the repair circuit.

Therefore, the main cell of a corresponding fail address is inactivated while the repair cell is activated.

The aforementioned related art method for repairing a fail address of a nonvalitile semiconductor memory device has several problems.

If a fail bit is generated, the analysis step of the fail bit is additionally required. In this case, a problem arises in that the redundancy algorithm becomes complicate. For this reason, there is limitation in reducing the redundancy time.

Furthermore, since the fuse is cut using the laser beam to repair the failed cell, it is difficult to change or add the redundancy algorithm at any time.

SUMMARY OF THE INVENTION

Accordingly, the present invention is directed to a fail repair circuit of a nonvolatile ferro electric memory device and a method for repairing the same that substantially obviates one or more problems due to limitations and disadvantages of the related art.

An object of the present invention is to provide a fail repair circuit of a nonvolatile ferroelectric memory device and a method for repairing the same, in which a redundancy time can be reduced.

Another object of the present invention is to provide a fail repair circuit of a nonvolatile ferroelectric memory device and a method for repairing the same, in which a redundancy algorithm can be changed or added at any time.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a fail repair circuit of a nonvolatile ferroelectric memory device having a repair logic unit therein, the fail repair circuit includes: a memory test logic block generating a redundancy active pulse (RAP) if a row address including a fail bit to be repaired is found during test; a power-up sensor generating a power-up pulse if a stable power source voltage is sensed; a first redundancy control block generating first to fifth control signals ENN, ENP, EQN, CPL, and PREC and a sixth control signal ENW in response to the RAP and the power-up pulse; a counter generating n bit counter bit signal increased by one bit through the RAP to correspond to the number of redundancy bits; a redundancy counter decoding control block generating an activated coding signal ENW<n> in response to the counter bit signal of the counter and the sixth control signal ENW; and a redundancy coding block outputting a master signal in response to the coding signal ENW<n> and the first to fifth control signals, programming a fail address in a plurality of redundancy coding cells, and outputting seventh and eighth control signals REN<n> and RPUL<n> to repair the programmed fail address.

In another aspect of the present invention, in a method for repairing fail of a nonvolatile ferroelectric memory device having a repair logic unit therein, the method includes the steps of: generating a redundancy active pulse (RAP) if a row address including a fail bit to be repaired is found during test; generating a power-up pulse if a stable power source voltage is sensed; generating first to fifth control signals ENN, ENP, EQN, CPL, and PREC and a sixth control signal ENW in response to the RAP and the power-up pulse, the first to fifth control signals controlling a redundancy coding block and the sixth control signal controlling a redundancy counter decoding control block; generating n bit counter bit signal increased by one bit through the RAP to correspond to the number of redundancy bits; generating an activated coding signal ENW<n> corresponding to the fail bit in response to the counter bit signal of the counter and the sixth control signal ENW; programming a fail bit(address) in the redundancy coding block including a redundancy master cell and a redundancy coding cell, each having ferroelectric capacitors, in response to the first to fifth control signals ENN, ENP, EQN, CPL, and PREC and the activated coding signal ENW<n>; and outputting seventh and eighth control signals REN<n> and RPUL<n> to repair the programmed fail address.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

All of memory devices including FRAM may decline a specific bit or generate a fail bit. Such a fail bit can be repaired by additionally arranging a redundancy cell in one chip.

In the present invention, when a fail bit is generated, a redundancy coding cell is constituted by fabricating a ferroelectric capacitor used for a nonvolatile ferroelectric memory device in the same manner as a process of fabricating a memory cell, thereby completing a redundancy circuit.

In other words, in a nonvolatile ferroelectric memory device having a repair logic circuit according to the present invention, a row fail repair circuit and a method for driving the same are provided, in which a logic coding method is used. In the present invention, when an address having a fail bit to be repaired is generated during test, the address is directly repaired.

A fail repair circuit of a nonvolatile ferroelectric memory device and a method for driving the same will be described with reference to FIGS. 4 and 5.

Figure 1:
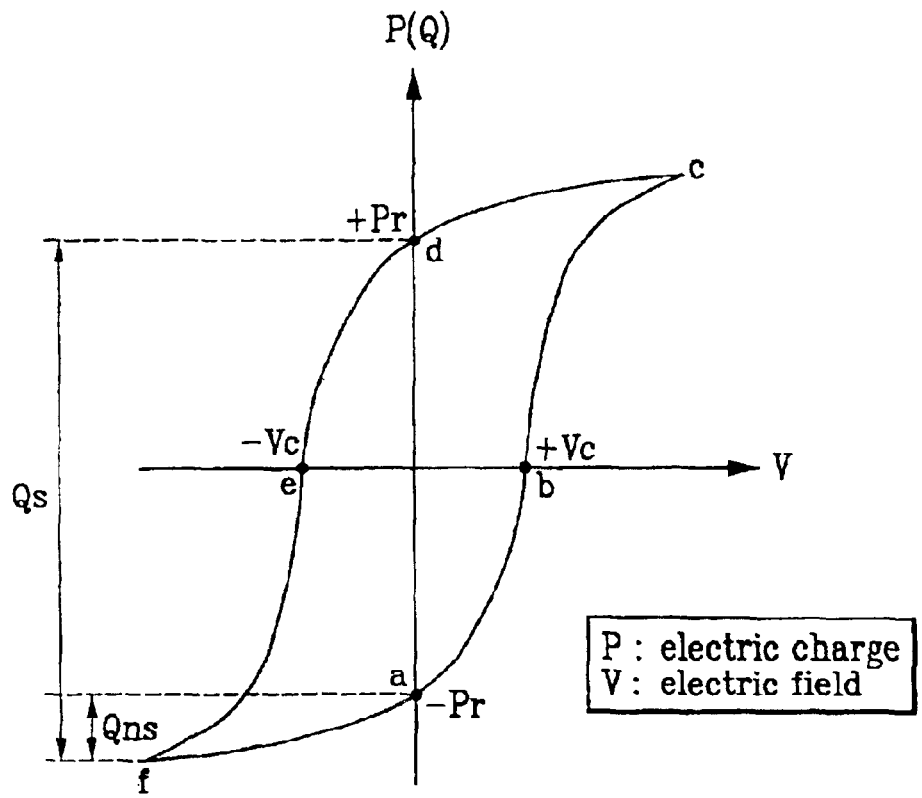
FIG. 1 shows a hysteresis loop of a general ferroelectric.
Figure 2:
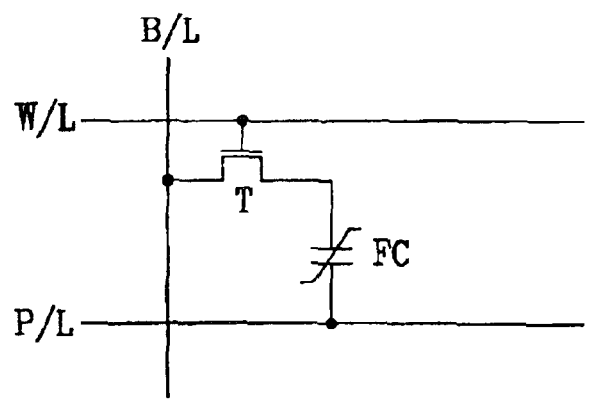
FIG. 2 is a schematic view of a unit cell of a related art nonvolatile ferroelectric memory device.
Figure 3:
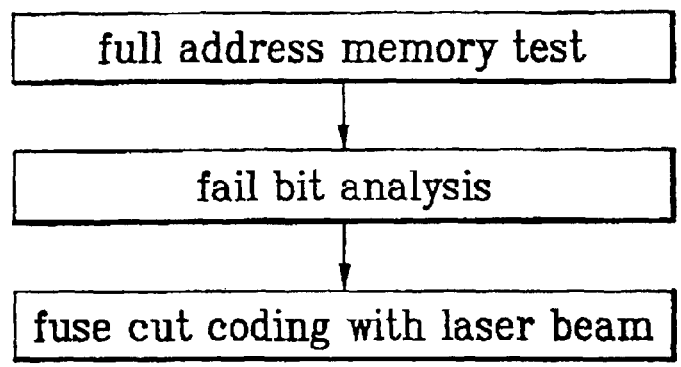
FIG. 3 is a block diagram illustrating a redundancy algorithm of the related art nonvolatile ferroelectric memory device.
Figure 4:
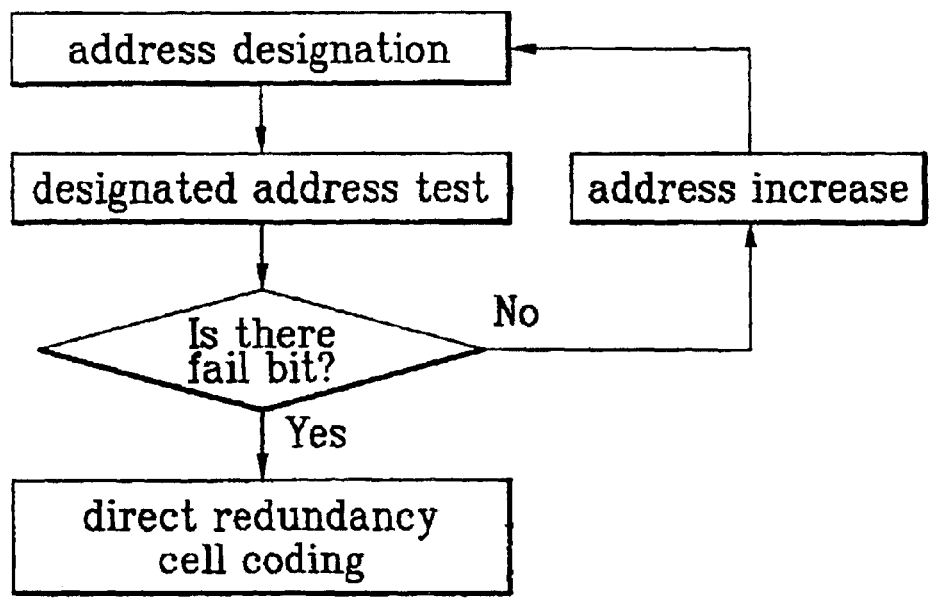
FIG. 4 is a block diagram illustrating a redundancy algorithm of a nonvolatile ferroelectric memory device according to the present invention.
Figure 5:
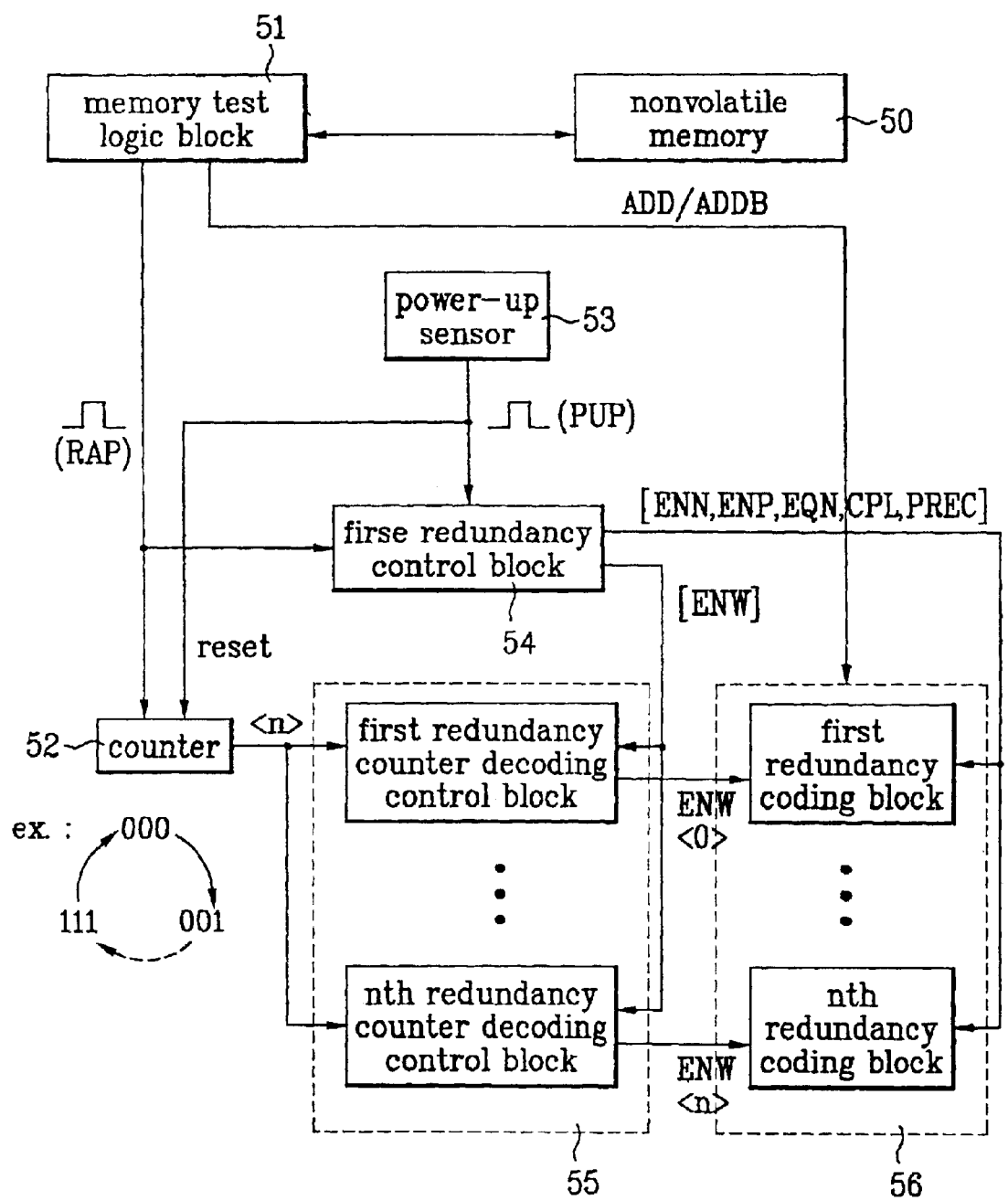
FIG. 5 is a detailed block diagram illustrating a redundancy algorithm of a nonvolatile ferroelectric memory device according to the present invention.

FIG. 4 is a block diagram illustrating a redundancy algorithm of a nonvolatile ferroelectric memory device according to the present invention, and FIG. 5 is a detailed block diagram illustrating a redundancy algorithm of a nonvolatile ferroelectric memory device according to the present invention.

As shown in FIGS. 4 and 5, the fail repair circuit of the nonvolatile ferroelectric memory device according to the present invention includes a nonvolatile memory device 50, a memory test logic block 51, a counter 52, a power-up sensor 53, a first redundancy control block 54, a redundancy counter decoding control block 55, and a redundancy coding block 56.

The nonvolatile memory device 50 includes FRAM. The memory test logic block 51 is to test the nonvolatile memory device 50. A built-in self test (BIST) logic circuit is separately provided in an embedded system chip to enable memory test therein.

The memory test logic block 51 generates a redundancy active pulse (RAP) if an address having a fail bit is found in the nonvolatile memory device 50 during test.

The counter 52 is designed to generate n bit counter output from the RAP. In other words, if the number of redundancy bits is four, the counter 52 outputs 2 bits. If the number of redundancy bits is eight, the counter 52 outputs 3 bits. If the number of redundancy bits is sixteen, the counter 52 outputs 4 bits.

For example, if the counter 52 is designed to output 3 bits with 8 redundancy bits, as shown in FIG. 5, bits "000" are increased to "111" and again back to "000". Such a cycle is repeated.

Since a trigger pulse of the counter 52 is the RAP, the RAP is generated if a fail bit is generated. In this case, the counter 52 has an increased bit by one bit by means of the RAP. The counter 52 is reset in response to a power up pulse (PUP) signal of the power-up sensor 53.

For example, if an initial state of the counter 52 is "111", the counter 52 outputs "000" by one RAP. Only RCDC<0> from the redundancy counter decoding control (RCDC) block 55 is activated by the code "000" while the other RCDC<n> is inactivated.

The power-up sensor. 53 generates the PUP signal if a power source voltage is input thereto.

The first redundancy control block 54 outputs redundancy control signals in response to the PUP signal of the power-up sensor 53 and the RAP signal of the memory test logic block 51. Of the redundancy control signals, an ENW signal involved in a fail address coding program serve to control the operation of the redundancy counter decoding control block 55.

In other words, an activated ENW<n> is output by the activated ENW input to the redundancy counter decoding control block 55.

Next, the redundancy counter decoding control block 55 includes a plurality of first redundancy counter decoding control block RCDC<0> to nth redundancy counter decoding control block RCDC(n>. The redundancy counter decoding control block 55 outputs the ENW<n> to the redundancy coding block 46, i.e., the redundancy coding block diagram (RCBD) in response to the counter bit signal output from the counter 52 and the redundancy control signal ENW output from the first redundancy control block 54.

The redundancy coding block (RCBD) 56 includes a plurality of first to nth redundancy coders.

The redundancy coding block 56 reads a redundancy coding state in response to first and second address signals ADD and ADDB, the signal ENW<n>, and signals ENN, ENP, EQN, CPL, and PREC. Also, the redundancy coding block 56 programs the fail address in a redundancy coding cell. If a corresponding fail address is input, a redundancy cell is used to repair it.

Figure 6:
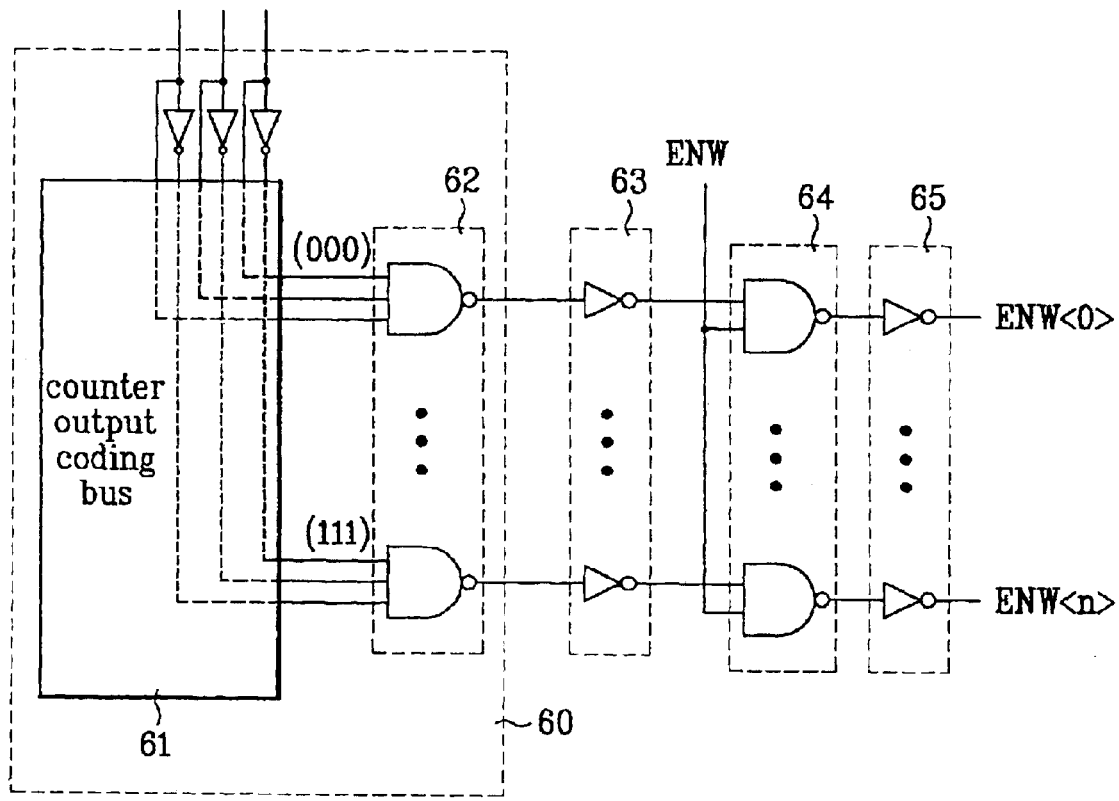
FIG. 6 is a schematic view of a redundancy counter decoding control (RCDC) block of FIG. 5.

The redundancy counter decoding control block 55 will now be described in more detail with reference to FIG. 6.

A counter output decoder 60 for outputting a counter bit signal from the counter 52 will first be described.

The counter output decoder 60 includes a counter output coding bus 61 for coding the counter bit signal output from the counter 52, and a first NAND gate block 62 consisting of a plurality of NAND gates performing logic AND operation of each coding signal from the counter output coding bus 61 and inverting the resultant value.

The redundancy counter decoding control block 55 includes a first inverter block 63 consisting of a plurality of inverters inverting an output signal of each NAND gate of the first NAND gate block 62, a second NAND gate block 64 consisting of a plurality of NAND gates performing logic AND operation of an output signal of each inverter of the first inverter block 63 and the ENW signal of the first redundancy control block 54 and inverting the resultant value, and a second inverter block 65 consisting of a plurality of inverters inverting an output signal of each NAND gate of the second NAND gate block 64 and outputting signal ENW<n>.

The redundancy counter decoding control block 55 codes one redundancy block by activating only one redundancy control signal ENW<n> when a counter code is changed one time. Thus, only one redundancy coding block is activated.

A circuit of an FRAM chip for realizing a row redundancy algorithm according to the present invention will be described below.

Figure 7:
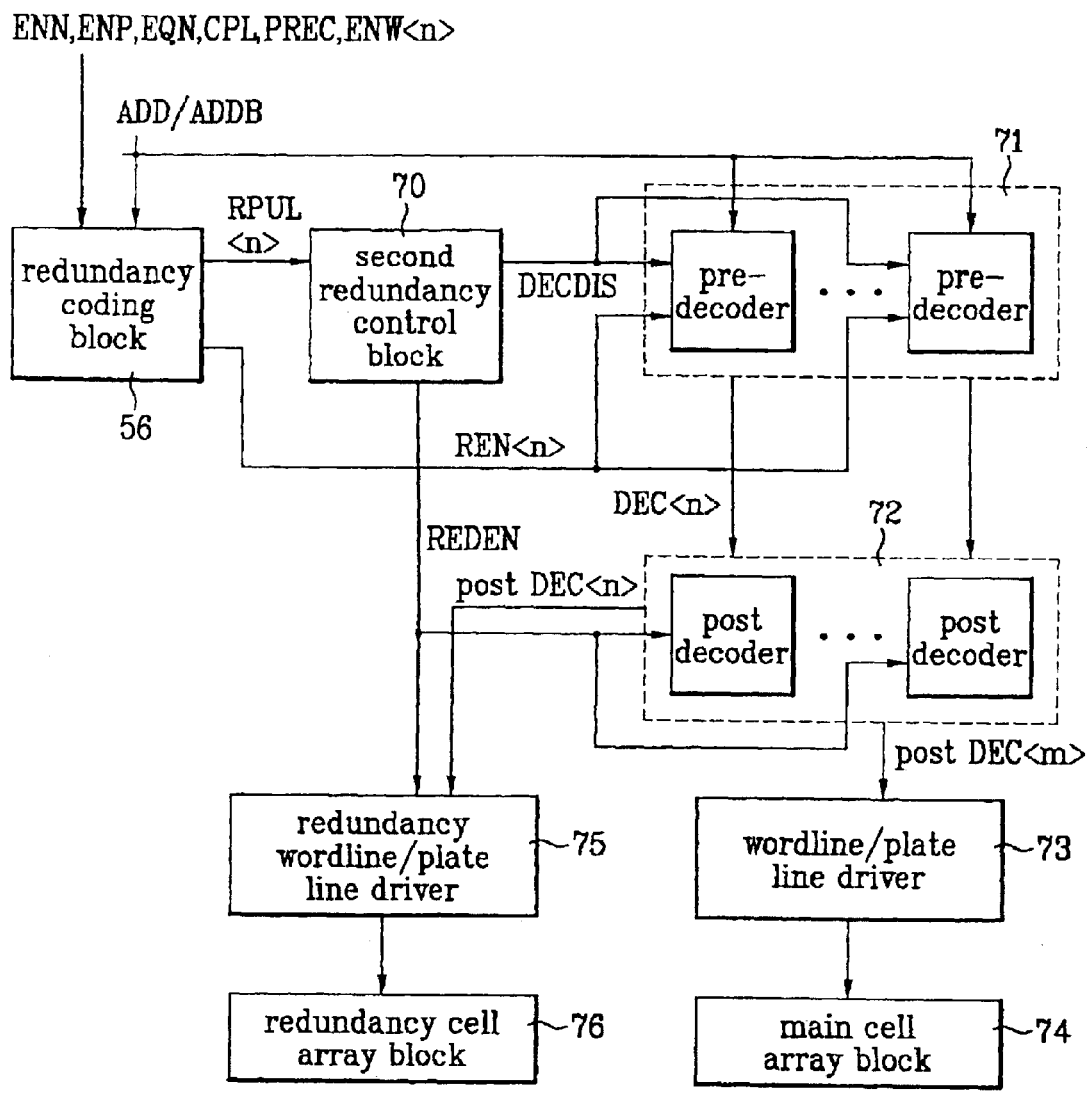
FIG. 7 is a block diagram illustrating a row redundancy algorithm according to the present invention.

FIG. 7 is a block diagram illustrating the row redundancy algorithm according to the present invention.

As shown in FIG. 7, the FRAM chip for realizing the row redundancy algorithm includes a redundancy coding block 56, a second redundancy control block 70, a predecoder block 71, a post decoder block 72, a wordline/plate line driver 73, a main cell array block 74, a redundancy wordline/plate line driver 75, and a redundancy cell array block 76.

The redundancy coding block 56 is to store an address of a current cycle in a redundancy cell. As shown in FIGS. 5 and 7, the redundancy coding block 56 is operated in response to the signals ENN, ENP, EQN, CPL, and PREC output from the first redundancy control block 54, the signal ENW<n> output from the redundancy counter decoding control block 55, and the first and second address signals ADD/ADDB output from the memory test logic block 51. Then, the redundancy coding block 56 outputs the signal RPUL<n> of n bit to the second redundancy control block 70 and also outputs the REN<n> to a plurality of predecoders of the predecoder block 71.

Next, the second redundancy control block 70 outputs a signal DECDIS to the predecoders of the predecoder block 71 in response to the RPUL<n> from the redundancy coding block 56, and also outputs a signal REDEN to the redundancy wordline/plate line driver 75.

The post decoder block 72 includes a plurality of post decoders.

The predecoder 71 inactivates a normal predecoder path using the signal DECDIS input from the second redundancy control block 70 and activates a predcoder output path that can be used as a redundancy circuit, using the signal REN<n>.

The normal post decoder path is inactivated in response to the operation of the predecoder 71. The post decoder is activated as it receives a signal DEC<n> from the predecoder activated by the signal REN<n>.

The redundancy wordline/plate line driver 75 is activated as it receives Post DEC<n> output from the activated post decoder and the signal REDEN output from the second redundancy control block 70. Thus, a corresponding redundancy cell of the redundancy cell array block 76 is activated.

A corresponding main cell of the main cell array block 74 is inactivated while the redundancy cell is activated.

A detailed circuit structure of the redundancy coding block 56, the second redundancy control block 70, and the predecoder 71 and their operation will be described below.

Figure 8:
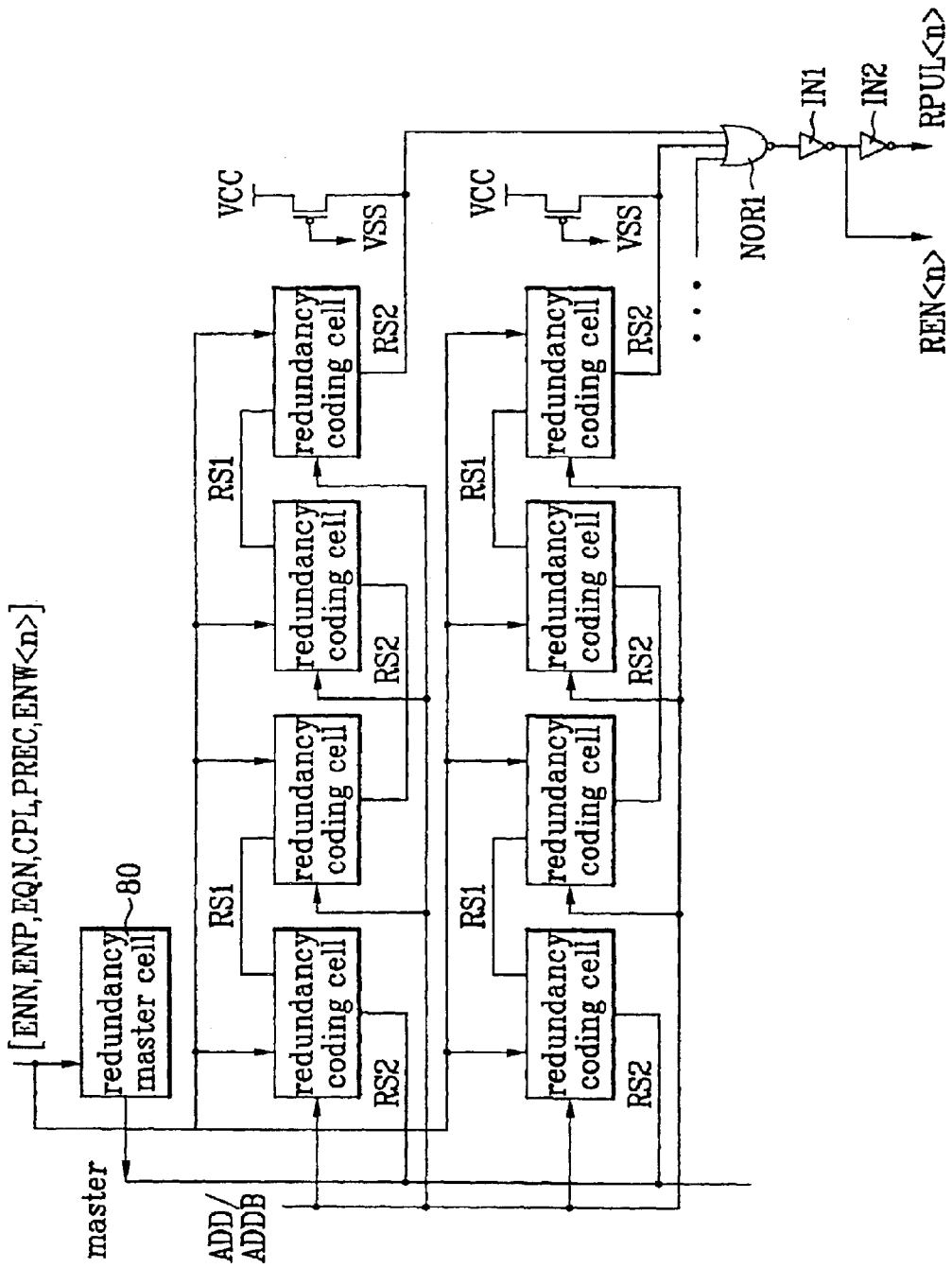
FIG. 8 is a block diagram of a redundancy coding block of FIGS. 5 and 7.
Figure 9:
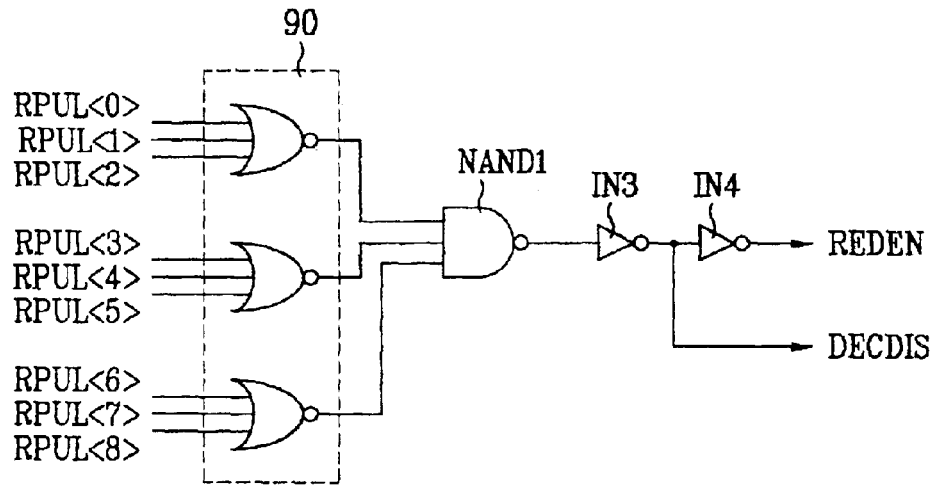
FIG. 9 is a block diagram illustrating a second redundancy coding block of FIG. 7.
Figure 10:
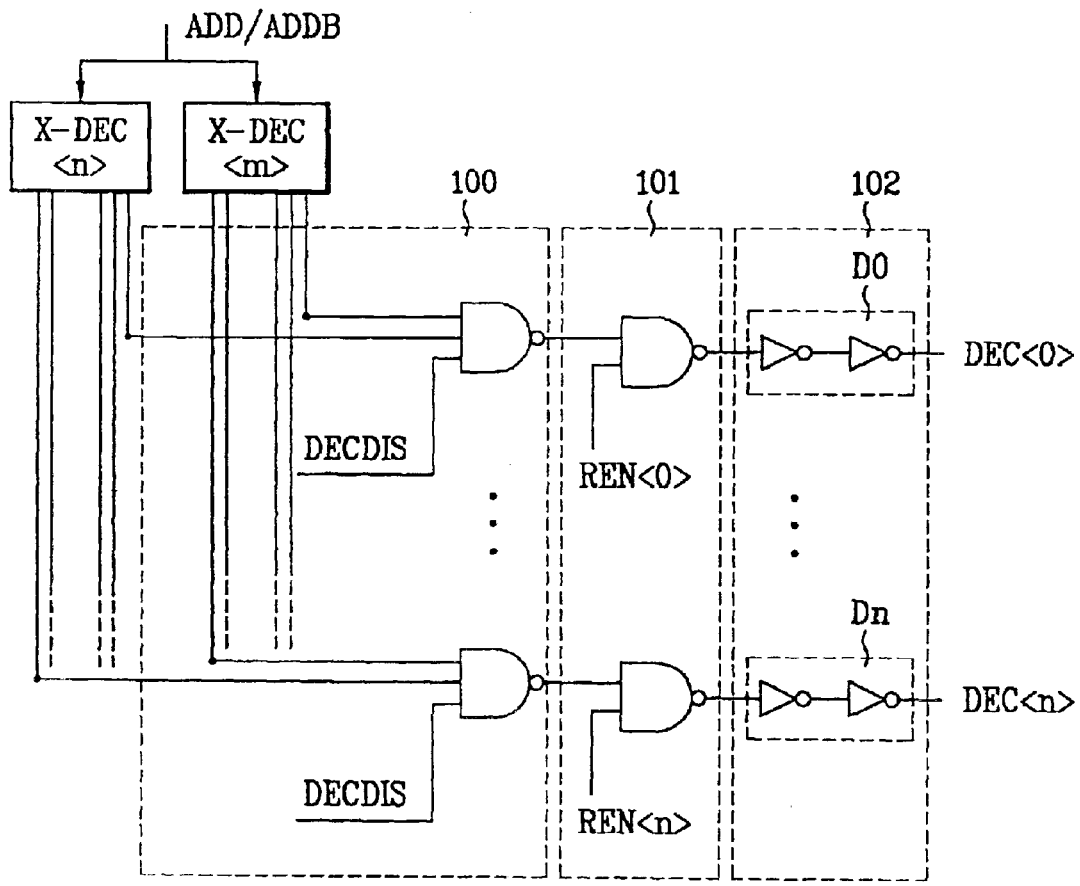
FIG. 10 is a circuit diagram illustrating a predecoder of FIG. 7.

FIG. 8 is a block diagram of a redundancy coding block of FIGS. 5 and 7, FIG. 9 is a block diagram illustrating a second redundancy coding block of FIG. 7, and FIG. 10 is a circuit diagram illustrating a predecoder of FIG. 7.

As shown in FIG. 8, one redundancy coding block 56 includes a redundancy master cell 80 and a plurality of redundancy coding cells. The redundancy coding block 56 further includes a first NOR gate NOR1 performing logic OR operation of an output signal according to on/off state of the redundancy coding cells and inverting the resultant value, a first inverter IN1 inverting a signal of the first NOR gate NOR1 and outputting a signal REN<n>, a second inverter IN2 inverting a signal of the first inverter IN1 and outputting a signal RPUL<n>, and PMOS transistors respectively arranged in final output terminals of the redundancy coding cells connected in a row direction.

Each of the PMOS transistors is arranged in such a manner that a ground voltage VSS is connected between each final output terminal of the redundancy coding cells and a power source voltage terminal VCC.

At this time, the master signal is input to one input terminal of the first NOR gate NOR1 depending on a connection state between RS1 and RS2 following the operation of four redundancy coding cells. The first redundancy coding cell is connected with the second redundancy coding cell through RS1. The second redundancy coding cell is connected with the third redundancy coding cell through RS2. The third redundancy coding cell is connected with the fourth redundancy coding cell through RS1.

The redundancy master cell 80 is to determine whether to activate or inactivate the whole redundancy coding cells.

The redundancy master cell 80 and the redundancy coding cells are operated in response to the signals ENN, ENP, EQN, CPL, and PREC output from the first redundancy control block 54 and the signal ENW<n> output from the redundancy counter decoding control block 55.

When the redundancy master cell 80 is inactivated (default state), it outputs a master signal of high level. When the redundancy master cell 80 is activated, it outputs a master signal of low level.

The redundancy coding cells serve to store an actual fail column address.

In a state that the fail column address is stored in the redundancy coding cells, if a fail column address equal to the stored fail column address is input, RS1 and RS2 are connected with each other, i.e., no resistance occurs, thereby flowing current thereto. If not so, RS1 and RS2 are not connected with each other, i.e., high resistance occurs.

Therefore, only if all the redundancy coding cells are turned on, the signal REN<n> is output at low level. If not so, the signal REN<n> is output at high level.

As shown in FIG. 7, only if the signal REN<n> is low, the redundancy path of the predecoder can be activated.

Meanwhile, the signal RPUL<n> can be output at high level in case of a corresponding redundancy operation.

One signal REN<n> and one signal RPUL<n> are output from the unit redundancy coding block.

The second redundancy control block 70 will be described with reference to FIG. 9.

As shown in FIG. 9, the second redundancy control block 70 includes a NOR gate block 90 consisting of a plurality of third input NOR gates, a first NAND gate NAND1 performing logic AND operation of each output signal of the NOR gates of the NOR gate block 90 and inverting the resultant value, a third inverter IN3 inverting an output signal of the first NAND gate NAND1 and outputting a signal DECDIS, and a fourth inverter IN4 inverting the signal of the third inverter IN3 and outputting a signal REDEN.

The signal REDEN is directly input to the redundancy wordline/plate line driver 75, and the signal DECDIS is used to inactivate a main predecoder path.

A detailed circuit of the redundancy predecoder for activating the redundancy path will now be described with reference to FIG. 10.

As shown in FIGS. 7 and 10, the predecoder block 71 includes a plurality of predecoders. Each of the predecoders includes a first row address from X-DEC<n>, a second row address from X-DEC<m>, a third NAND gate block 100 consisting of a plurality of NAND gates operating in response to the signal DECDIS from the second redundancy control block 70, a fourth NAND gate block 101 consisting of a plurality of NAND gates operating in response to the output signal of each NAND gate of the third NAND gate block 100 and the signal REN<n>, and a delay circuit 102 consisting of a plurality of delay units D0~Dn delaying and outputting the output signal of each NAND gate of the fourth NAND gate block 101.

When the signal DECDIS is low, all the NAND gates of the third NAND gate block 100 output high level regardless of the first and second address signals ADD and ADDB.

In another predecoder, the signal DECDIS is used to inactivate a main predecoder path. Accordingly, the output of each NAND gate of the fourth NAND gate block 101 is determined by the signal REN<n>.

The fourth NAND gate 102 outputs the output signal DEC<n> through the respective delay units D0~Dn of the delay circuit 102 in response to the signal REN<n>.

As described above, the output signal of the predecoder block is determined by only the signal REN<n> regardless of the address signal. Also, the state of the signal DEC<n> is determined depending on which REN<n> has been activated at low level.

Next, signal input/output relation of the post decoder block 72, the redundancy wordline/plate line driver 75, and the redundancy cell array block 76 operating in response to the signal DEC<n> output from the predecoder block 71 will be described with reference to FIG. 11.

Figure 11:
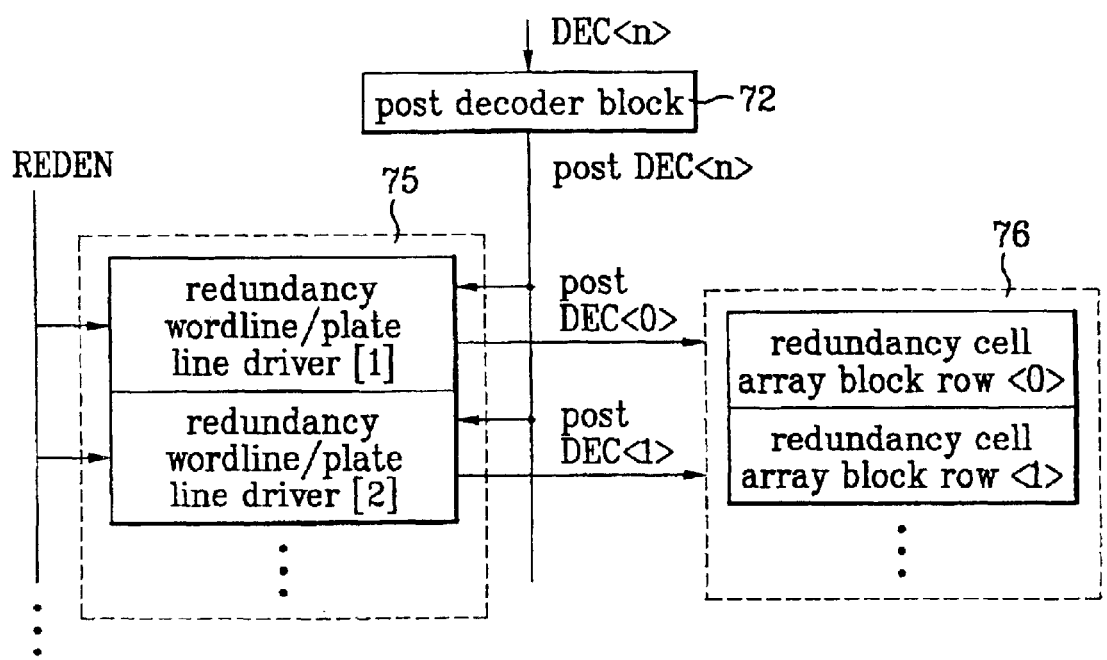
FIG. 11 is a schematic view illustrating a signal input/output relation of a post decoder, a redundancy wordline driver, a plate line driver, and a redundancy cell array block.

As shown in FIG. 11, the post decoder block 72 outputs a signal Post DEC<n> to the redundancy wordline/plate line driver 75 in response to the signal DEC<n> output from the predecoder block 71. The redundancy cell array block 76 operates in response to the signals REDEN and Post DEC<n> from the post decoder block 72.

The signal DEC<n> is used to select one of a plurality of row addresses from the redundancy cell array block. Consequently, the signal DEC<n> is used to activate one of the row addresses in the redundancy wordline/plate line driver 75.

In a normal operation region, all the signals REN<n> are maintained at high level and the signal DECDIS is also maintained at high level, so that a normal address decoder path is activated.

The redundancy coding cell and the redundancy master cell will be described with reference to FIGS. 12 and 13.

Figure 12:
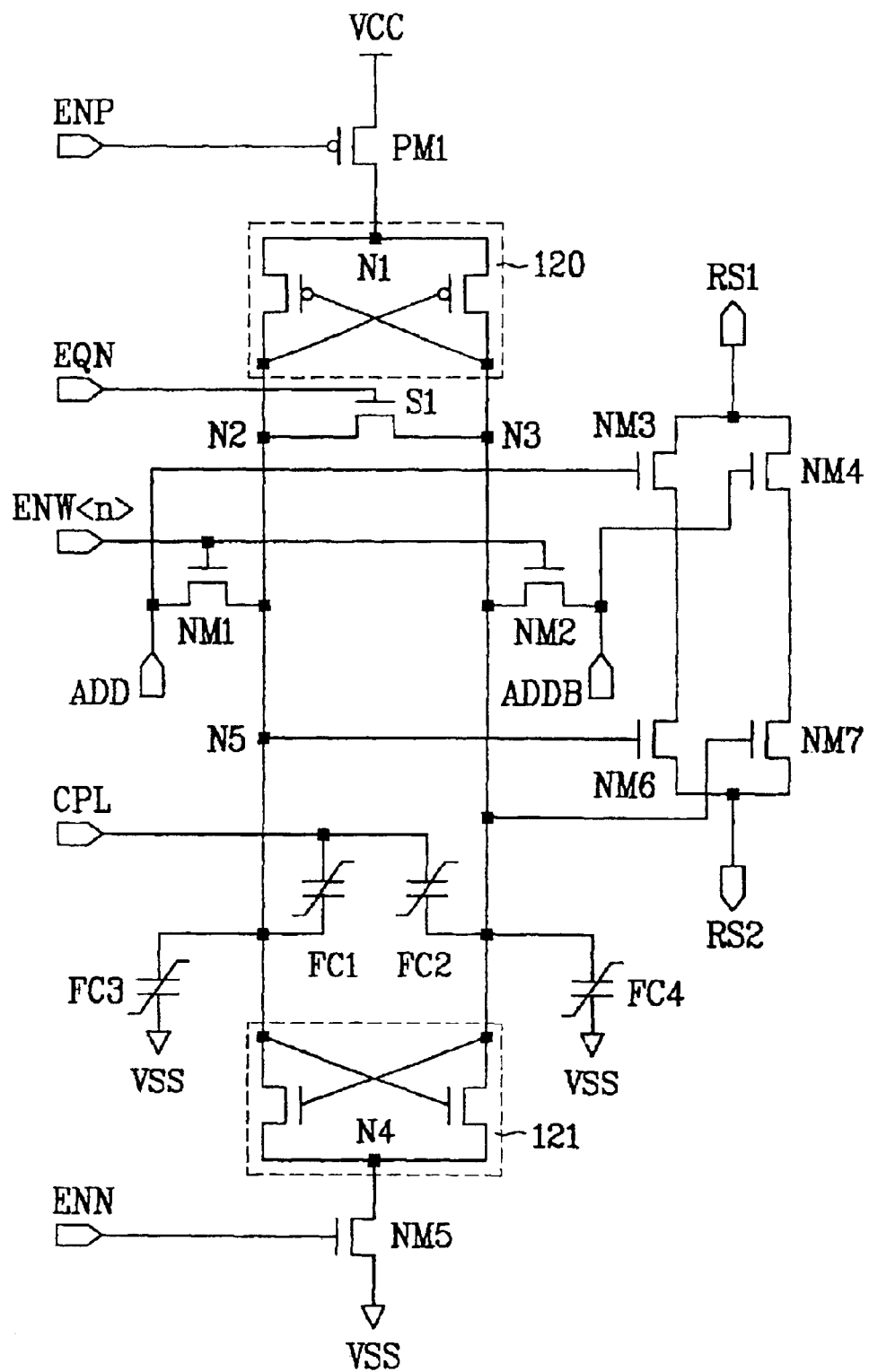
FIG. 12 is a circuit diagram illustrating a redundancy coding cell of FIG. 8.

As shown in FIG. 12, the redundancy coding cell determines whether to connect RS1 to RS2 in response to the signals ENN, ENP, EQN, CPL, ENW, ADD, and ADDB. The redundancy master cell determines whether to output the master signal in response to the signals ENN, ENP, EQN, CPL, PREC, and ENW.

First, the redundancy coding cell, as shown in FIG. 12, includes a first PMOS transistor PM1 transferring a power source voltage VCC to a first node N1 in response to the signal ENP; a first latch 122 having one node connected with the first node N1 and the other node connected with second and third nodes N2 and N3; a first NMOS switch S1 controlling whether to connect the second node N2 with the third node N3 in response to the signal EQN; a first NMOS transistor NM1 having a gate terminal to which the signal ENW is input, a source terminal to which a signal of the second node N2 is transferred, and a drain terminal to which the first address signal ADD is input; a second NMOS transistor NM2 having a gate terminal to which the signal ENW<n> is input, a source terminal to which a signal of the third node N3 is transferred, and a drain terminal to which the second address signal ADDB is input; third and fourth NMOS transistors NM3 and NM4 turned on/off depending on the first and second address signals ADD and ADDB; a fifth NMOS transistor NM5 transferring the ground voltage VSS to a fourth node N4 in response to the signal ENN; a second latch 121 having one node connected with the fourth node N4 and the other node connected with fifth and sixth nodes N5 and N6; a first ferroelectric capacitor FC1 arranged between an input node of the signal CPL and the fifth node N5; a second ferroelectric capacitor FC2 arranged between the input node of the signal CPL and the sixth node N6; a third ferroelectric capacitor FC3 arranged between the fifth node N5 and the ground voltage terminal VSS; a fourth ferroelectric capacitor FC4 arranged between the sixth node N6 and the ground voltage terminal VSS; and sixth and seventh NMOS transistors NM6 and NM7 turned on/off under the control of the signals of the fifth and sixth nodes N5 and N6.

If either the third and sixth NMOS transistors NM3 and NM6 or the fourth and seventh NMOS transistors NM4 and NM7 are turned on, RS1 is connected with RS2.

The first latch 120 includes two PMOS transistors while the second latch 121 includes two NMOS transistors.

Data stored in the first and second ferroelectric capacitors FC1 and FC2 are opposite to each other. The third and fourth ferroelectric capacitors FC3 and FC4 serve as capacitance loading elements required to sense and read the stored data.

The RS1 and RS2 are output nodes that determine which fail address is stored in the redundancy coding cell.

For example, if the fail address is high, the ADD is high while the ADDB is low.

If the first and second NMOS transistors NM1 and NM2 are turned on by the signal ENW<n>, high data and low data are respectively stored in the first and second ferroelectric capacitors FC1 and FC2.

At this time, if a corresponding fail address is input after redundancy coding, the fifth node N5 and the ADD become high level, so that the third and sixth NMOS transistors NM3 and NM6 are turned on. Thus, the RS1 and RS2 are under low resistance state in which they are electrically connected with each other.

By contrast, if an address other than the corresponding fail address is input, the fifth node N5 is maintained at high level while the ADD is maintained at low level, so that the third NMOS transistor NM3 is turned off while the sixth NMOS transistor NM6 is turned on. Thus, the RS1 and RS2 are under high resistance state in which they are not electrically connected with each other.

If the fail address is low, the ADD becomes low while the ADDB becomes high.

If the ENW<n> activated at high level is input, the first and second NMOS transistors NM1 and NM2 are turned on so that low data and high data are respectively stored in the first and second ferroelectric capacitors FC1 and FC2.

If a corresponding fail address is input after redundancy coding, the sixth node N6 and the ADDB become high level, so that the fourth and seventh NMOS transistors NM4 and NM7 are turned on. Thus, the RS1 and the RS2 are under low resistance state in which they are electrically connected with each other.

By contrast, if an address other than the corresponding fail address is input, the sixth node N6 is maintained at high level while the ADDB is maintained at low level, so that the fourth NMOS transistor NM4 is turned off while the seventh NMOS transistor NM7 is turned on. Thus, the RS1 and RS2 are under high resistance state in which they are not electrically connected with each other.

Therefore, the corresponding fail address can be coded.

The structure of the redundancy master cell will be described with reference to FIG. 13.

Figure 13:
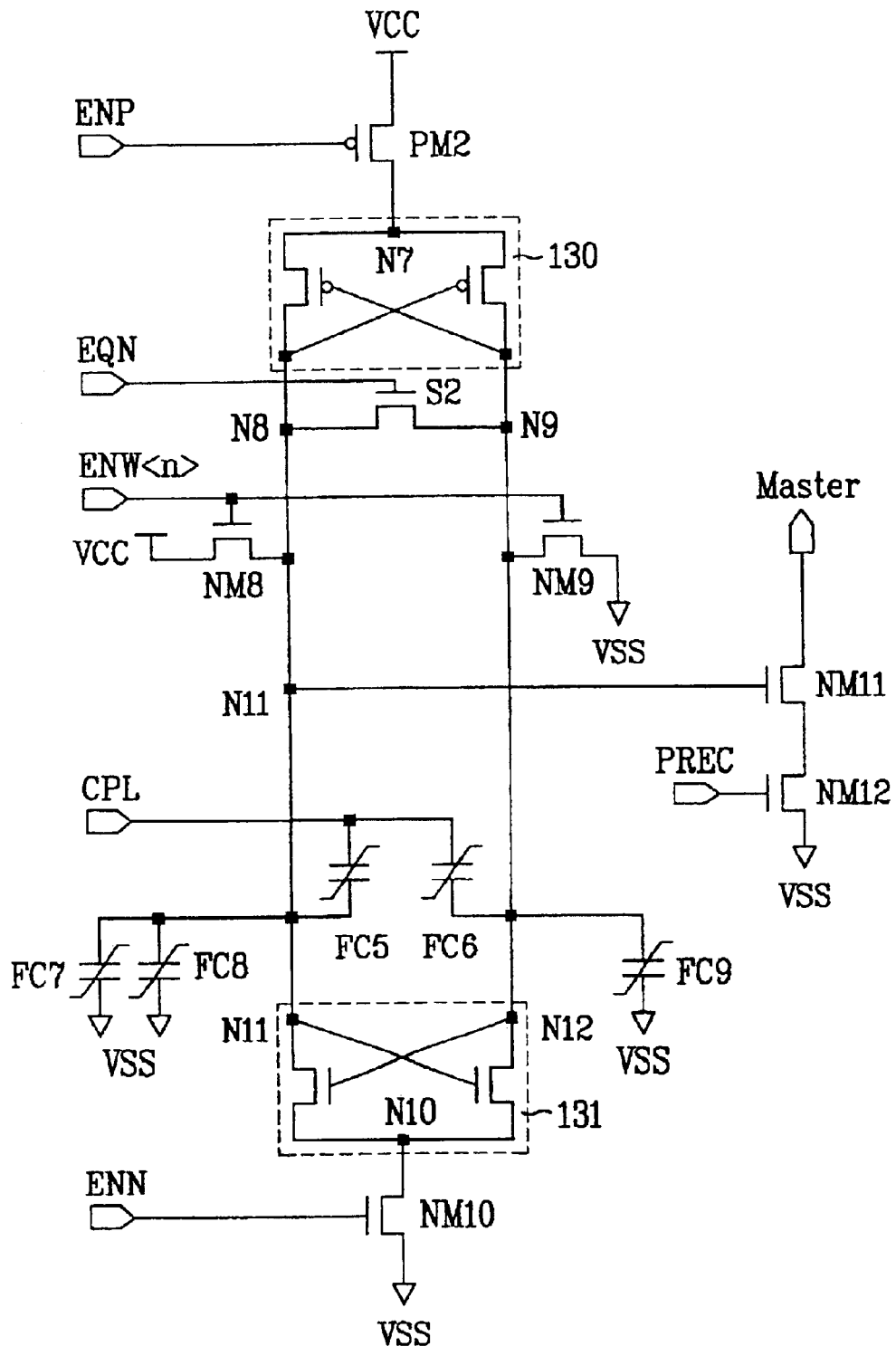
FIG. 13 is a circuit diagram illustrating a redundancy master cell of FIG. 8.

As shown in FIG. 13, the redundancy master cell includes a second PMOS transistor PM2 transferring the power source voltage VCC to a seventh node N7 in response to the signal ENP; a third latch 130 having one node connected with the seventh node N7 and the other node connected with eighth and ninth nodes N8 and N9; a second NMOS switch S2 controlling whether to connect the eighth node N8 with the ninth node N9 in response to the signal EQN; an eighth NMOS transistor NM8 having a gate terminal to which the signal ENW<n> is input, a source terminal to which a signal of the eighth node N8 is transferred, and a drain terminal to which the power source voltage is input; a ninth NMOS transistor NM9 having a gate terminal to which the signal ENW<n> is input, a source terminal to which a signal of the ninth node N9 is transferred, and a drain terminal to which the ground voltage VSS is input; a tenth NMOS transistor NM10 transferring the ground voltage VSS to a tenth node N10 in response to the signal ENN; a fourth latch 131 having one node connected with the tenth node N10 and the other node connected with eleventh and twelfth nodes N11 and N12; a fifth ferroelectric capacitor FC5 arranged between the input terminal of the signal CPL and the eleventh node N11; a sixth ferroelectric capacitor FC6 arranged between the input terminal of the signal CPL and the twelfth node N12, seventh and eighth ferroelectric capacitors FC7 and FC8 arranged in parallel between the eleventh node N11 and the ground voltage terminal VSS; a ninth ferroelectric capacitor FC9 arranged between the eleventh node N11 and the ground voltage terminal VSS; and eleventh and twelfth NMOS transistors NM11 and NM12 arranged in series between the output terminal of the master signal and the ground voltage terminal under the control of the eleventh node 11 and the signal PREC.

If the eleventh NMOS transistor NM11 and the twelfth NMOS transistor NM12 are turned on, the master signal is maintained at low level.

The third latch 130 includes two PMOS transistors while the fourth latch 131 includes two NMOS transistors.

As described above, data stored in the fifth and sixth ferroelectric capacitors FC5 and FC6 are opposite to each other. The seventh, eighth and ninth ferroelectric capacitors FC7, FC8, and FC9 serve as capacitance loading elements required to sense and read the stored data.

The redundancy master cell is operated in response to the signals ENN, ENP, EQN, CPL, ENW<n> used in the redundancy coding cell. The signal PREC has a path different from that of the master signal.

Also, since the VCC is always connected to the drain terminal of the eighth NMOS transistor NM8 and the VSS is always connected to the drain terminal of the ninth NMOS transistor NM9, high data is stored in the eleventh node while the low data is stored in the twelfth node during redundancy operation.

Therefore, the master signal may be maintained at low level or high level by the signal RREC during redundancy operation. In case of no redundancy operation, since the eleventh node is maintained at low level, the eleventh NMOS transistor NM11 is always turned off.

The signal PREC is maintained at high level in an active period where the chip enable signal CSB is low, so that the twelfth NMOS transistor NM12 is activated. While the signal PREC is maintained at low level in a precharge period, so that the twelfth NMOS transistor NM12 is inactivated.

Before the high data and the low data are respectively written in the ferroelectric capacitors FC5 and FC6, the capacitance load of the eleventh node N11 increases so that the low data is always stored in the eleventh node N11.

To increase the capacitance load of the eleventh node N11, the whole size of the ferroelectric capacitors FC7 and FC8 is designed to be greater than the size of the ferroelectric capacitor FC9.

The difference value in the capacitance load should not be affected by destructive charges when high data is stored in one node of the ferroelectric capacitor FC5.

In other words, if high charge of the ferroelectric capacitor FC5 is supplied to the eleventh node N11, a voltage level of the eleventh node N11 is higher than that of the twelfth node N12 even though the eleventh node N11 has a greater capacitance load than the capacitance load of the twelfth node N12.

A method for repairing a failed address of a nonvolatile ferroelectic memory device according to the present invention will be described with reference to FIGS. 14 and 15.

Figure 14:
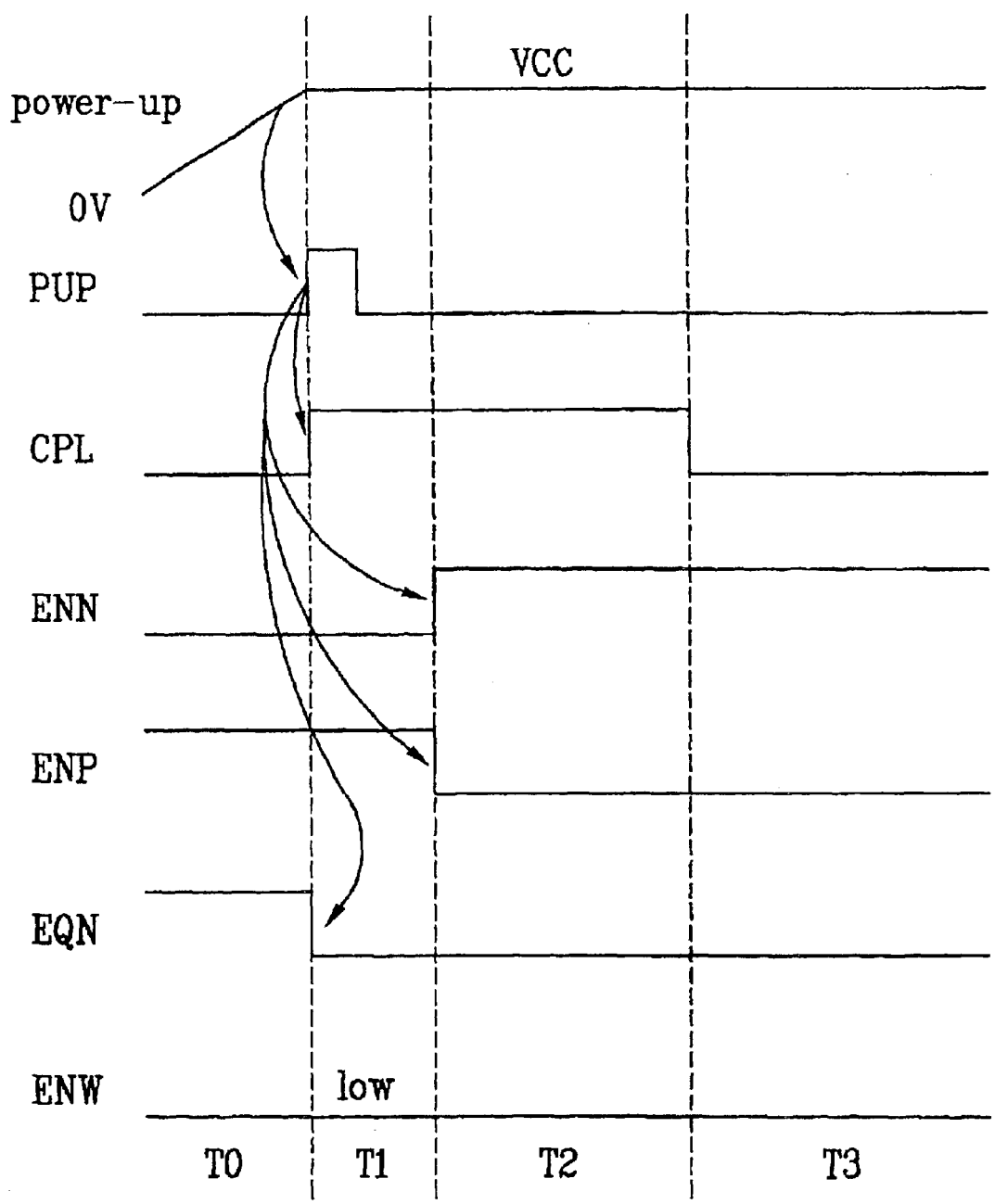
FIG. 14 is a timing chart illustrating the operation of the redundancy coding cell and the redundancy master cell in a power-up mode.
Figure 15:
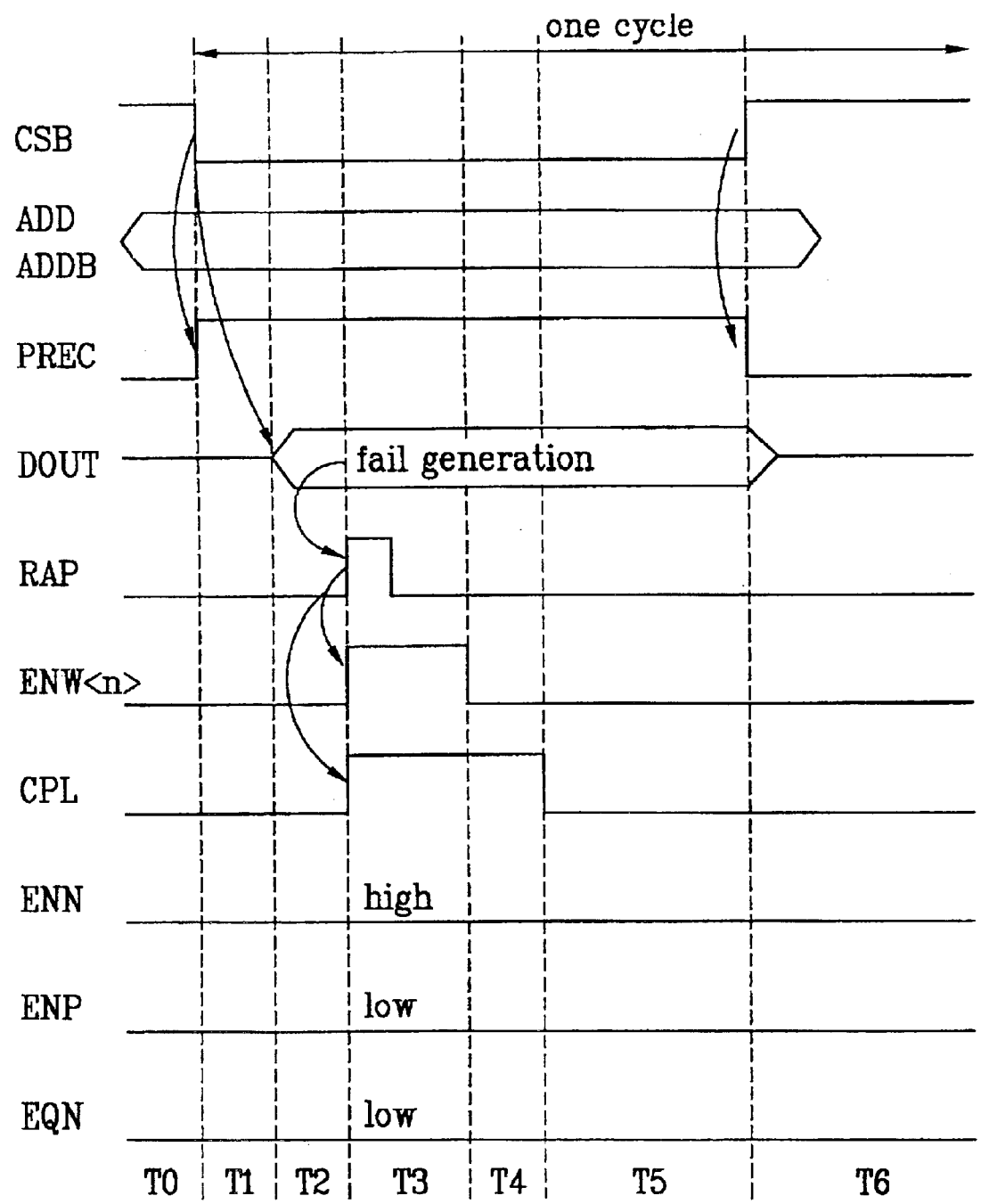
FIG. 15 is a timing chart illustrating the operation of the redundancy coding cell and the redundancy master cell in a fail address program.

FIG. 14 is a timing chart illustrating the operation of the redundancy coding cell and the redundancy master cell in a power-up mode, and FIG. 15 is a timing chart illustrating the operation of the redundancy coding cell and the redundancy master cell in a fail address program.

The operation of the nonvolatile ferroelectric memory device will be described in a power supply mode a built-in self test (BIST) mode.

First, the power supply mode, as shown in FIG. 14, is operated by a power-up mode. Namely, the power supply mode is to sense data stored in a redundancy cell and is performed by the power-up mode.

The operation of storing a fail address during the BIST mode in the redundancy cell is shown in FIG. 15.

In the power supply mode, as shown in FIG. 14, a power-up sensing pulse PUP is generated if the power up supply reaches a stable level. If the PUP is generated, the EQN is transited from high level to low level so that the CPL is transited from low level to high level.

The charges stored in the first and second ferroelectric capacitors FC1 and FC2 of FIG. 12 generate the voltage difference in both nodes of the cell, i.e., the fifth and sixth nodes by the capacitance load of the third and fourth ferroelectric capacitors FC3 and FC4.

Furthermore, the charges stored in the fifth and sixth ferroelectric capacitors FC5 and FC6 of FIG. 13 generate the voltage difference in both nodes of the cell, i.e., the eleventh and twelfth nodes by the capacitance load of the seventh, eighth, and ninth ferroelectric capacitors FC7, FC8, and FC9.

Afterwards, if the voltage difference is generated between the fifth and sixth nodes, between the eleventh and twelfth nodes, and between the seventeenth and eighteenth nodes, the ENN and the ENP are respectively activated at high level and low level, so that data at both ends of the cell are amplified.

If the data at both ends of the cell are amplified, the CPL is transited to low level again so that the destructed high data of the ferroelectric capacitor FC1 or FC2 are recovered.

At this time, the ENW<n> is inactivated at low level so that external data is prevented from being written.

Next, in the BIST mode, it is tested whether a fail bit has been generated in the nonvolatile ferroelectric memory device. If the fail bit has been generated, a method for repairing the fail bit will be described.

As shown in FIG. 5, a nonvolatile ferroelectric memory device 50 (FRAM) is tested. If the fail bit is generated, the RAP is generated in the memory test logic block 51.

The first redundancy control block 54 that receives the RAP generates the CPL signal and the ENW signal of high level.

At this time, the ENN is output at high level, the ENP at low level, and the EQN at low level.

The counter 52 that received the RAP from the memory test logic block 51 outputs a counting signal to the counter output coding bus 61.

The redundancy counter decoding control block that received the ENW from the first redundancy control block 54 and the counting signal from the counter 52 outputs ENW<n> of high level to a corresponding redundancy coding block.

The corresponding redundancy coding block, as shown in FIGS. 7 and 8, outputs the signals RPUL<n> and REN<n> through the redundancy master cell 80 and the redundancy coding cells.

At this time, the redundancy master cell 80 and the plurality of redundancy coding cells receive the signals ENN, PREC, and CPL at high level and the signals ENP, EQN, ADD, and ADDB at low level from the first redundancy control block 54, and receive the signal ENW<n> having a certain width at high level from a corresponding redundancy counter decoding control block.

The redundancy master cell 80, as shown in FIG. 13, outputs a master signal through the circuit of FIG. 13 before outputting the signals RPUL<n> and REN<n>. The redundancy coding cells, as shown in FIG. 12, code failed redundancy cells through the circuit of FIG. 12.

When the existing data is changed to new data as a fail address is generate, fail address data is stored in the redundancy coding cell of FIG. 12 and the redundancy master cell is activated using the circuit of FIG. 13.

For example, when the fail address is high, the signal ADD is high while the signal ADDB is low.

If the first and second NMOS transistors NM1 and NM2 are turned on by the signal ENW<n>, high data and low data are respectively stored in the first and second ferroelectric capacitors FC1 and FC2.

At this time, if a corresponding fail address is input after redundancy coding, the fifth node N5 and the signal ADD become high level, so that the third and sixth NMOS transistors NM3 and NM6 are turned on. Thus, the RS1 and the RS2 are under low resistance state in which they are electrically connected with each other.

By contrast, if an address other than the corresponding fail address is input, the fifth node N5 is maintained at high level while the signal ADD is maintained at low level, so that the third NMOS transistor NM3 is turned off while the sixth NMOS transistor NM6 is turned on. Thus, the RS1 and the RS2 are under high resistance state in which they are not electrically connected with each other.

If the fail address is low, the signal ADD becomes low while the signal ADDB becomes high.

If the signal ENW<n> activated at high level is input, the first and second NMOS transistors NM1 and NM2 are turned on so that low data and high data are respectively stored in the first and second ferroelectric capacitors FC1 and FC2.

If a corresponding fail address is input after redundancy coding, the sixth node N6 and the signal ADDB become high level, so that the fourth and seventh NMOS transistors NM4 and NM7 are turned on. Thus, the RS1 and the RS2 are under low resistance state in which they are electrically connected with each other.

By contrast, if an address other than the corresponding fail address is input, the sixth node N6 is maintained at high level while the signal ADDB is maintained at low level, so that the fourth NMOS transistor NM4 is turned off while the seventh NMOS transistor NM7 is turned on. Thus, the RS1 and the RS2 are under high resistance state in which they are not electrically connected with each other.

Therefore, the corresponding fail column address can be coded.

The output of the master signal will be described with reference to FIG. 13.

The existing data at both ends of the cells shown in FIGS. 12 and 13 is changed to the fail address data while the signal ENW<n> is maintained at high level. The changed fail address data is stored in the ferroelectric capacitors FC1 and FC2. To this end, as shown in FIGS. 12 and 14, the ENW<n> is transited to low level after the CPL is transited to high level in the same manner as the ENW<n>, so that the CPL is transited to low level after a certain time period. This operation should be performed while the corresponding fail address is in active state during one cycle.

The second redundancy control block 70 that received the signal RPUL<n> outputs the signal DECDIS to the predecoder block 71 and also outputs the signal REDEN to the redundancy wordline/plate line driver 75.

At this time, the signal DECDIS serves to inactivate the normal predecoder path while activates only the predecoder output path that can be used as a redundancy circuit.

The signal REDEN serves to control the redundancy wordline/plate line driver 75 and is opposite to the signal DECDIS.

Afterwards, the predecoder block 71 outputs a signal DEC<n>, and the post decoder block 72 that received the signals REDEN and DEC<n> outputs a signal Post DEC<n> to the redundancy wordline/plate line driver 75.

At this time, the signal DEC<n> is used to activate one of a plurality of row addresses in the redundancy wordline/plate line driver 75, and is used to select one of the row addresses from the redundancy cell array block. Namely, the redundancy cell is coded to repair the cell where the fail address is generated.

The aforementioned fail repair circuit of a nonvolatile ferroelectric memory device and the method for repairing the same according to the present invention have the following advantages.

First, no analysis step of the fail bit is required. If the fail bit is generated during the address test, the failed address is directly repaired. Accordingly, the test and redundancy time can be reduced.

Furthermore, since the redundancy algorithm can be applied regardless of the chip type such as the wafer type or the package type, it is possible to change or add the redundancy algorithm at any time. Moreover, since the fail bit generated during the memory test can directly be repaired, the fail repair circuit of the present invention can be used for an embedded FRAM.

It will be apparent to those skilled in the art that various modifications and variations can be made in the fail repair circuit of nonvolatile ferroelectric memory device and method for repairing nonvolatile ferroelectric memory device of the present invention without departing from the spirit or scope of the invention. Thus, it is intended that the present invention cover the modifications and variations of this invention provided they come within the scope of the appended claims and their equivalents.

What is claimed is:

1. A coding cell of a nonvolatile ferroelectric memory device, comprising:

a first latch having one node connected with a first node and the other node connected with second and third nodes;

a first transistor having a gate terminal to which a gate control signal is input, a source terminal to which a signal of the second node is transferred, and a drain terminal to which a first data signal is input;

a second transistor having a gate terminal to which the gate control signal is input, a source terminal to which a signal of the third node is transferred, and a drain terminal to which a second data signal is input;

a second latch having one node connected with a fourth node and the other node connected with the second and third nodes;

a first ferroelectric capacitor arranged between an input terminal of a control signal and the second node;

a second ferroelectric capacitor arranged between the input terminal of the control signal and the third node;

a third ferroelectric capacitor arranged between the second node and a voltage terminal; and a fourth ferroelectric capacitor arranged between the third node and the voltage terminal.

2. The coding cell of claim 1, further comprising an equalizing block between the second and third nodes.

3. The coding cell of claim 1, further comprising a switching block operating in response to signals of the second and third nodes.

4. A coding cell of nonvolatile of ferroelectric memory device, comprising:

a PMOS transistor transferring a power source voltage VCC to a first node in response to a first control signal;

a first latch having one node connected with the first node and the other node connected with second and third nodes;

a first transistor having a gate terminal to which a gate control signal is input, a source terminal to which a signal of the second node is transferred, and a drain terminal to which a first data signal is input;

a second transistor having a gate terminal to which the gate control signal is input, a source terminal to which a signal of the third node is transferred, and a drain terminal to which a second data signal is input;

a third transistor transferring a ground voltage VSS to a fourth node in response to a second control signal;

a second latch having one node connected with the fourth node and the other node connected with the second and third nodes;

a switching block operating in response to signals of the second and third nodes;

a first ferroelectric capacitor arranged between an input terminal of a third control signal and the second node;

a second ferroelectric capacitor arranged between the input terminal of the third control signal and the third node;

a third ferroelectric capacitor arranged between the second node and a voltage terminal; and a fourth ferroelectric capacitor arranged between the third node and the voltage terminal.

5. The coding cell of claim 4, further comprising an equalizing block between the second and third nodes.

6. The coding cell of claim 4, further comprising a switching block operating in response to signals of the second and third nodes.

* * * * *